United States Patent
You et al.

(10) Patent No.: US 10,750,642 B2
(45) Date of Patent: Aug. 18, 2020

(54) HARD DRIVE RACK VENTILATION STRUCTURE

(71) Applicant: AIC INC., Taoyuan (TW)

(72) Inventors: Hsih-Ting You, Taoyuan (TW); Yen-Chih Chen, Taoyuan (TW)

(73) Assignee: AIC INC., Taoyuan (TW)

( * ) Notice: Subject to any disclaimer, the term of this patent is extended or adjusted under 35 U.S.C. 154(b) by 29 days.

(21) Appl. No.: 16/198,848

(22) Filed: Nov. 22, 2018

(65) Prior Publication Data
US 2020/0170145 A1    May 28, 2020

(51) Int. Cl.
 *H05K 7/20* (2006.01)
 *G11B 33/14* (2006.01)
 *G11B 33/04* (2006.01)
 *H05K 7/14* (2006.01)

(52) U.S. Cl.
 CPC ..... *H05K 7/20709* (2013.01); *G11B 33/0461* (2013.01); *G11B 33/142* (2013.01); *H05K 7/1489* (2013.01)

(58) Field of Classification Search
 CPC ........... H05K 7/20009; H05K 7/20127; H05K 7/20445; H05K 7/20545
 USPC ...... 361/679.46, 679.49, 688–692, 728–730, 361/831
 See application file for complete search history.

(56) References Cited

U.S. PATENT DOCUMENTS

| | | | | |
|---|---|---|---|---|
| 7,190,574 B2* | 3/2007 | Muenzer | ................ | G06F 1/181 312/223.2 |
| 7,660,112 B2* | 2/2010 | Carr | ................ | G06F 1/187 312/223.1 |
| 7,839,637 B2* | 11/2010 | Pakravan | ........... | H05K 7/20572 165/122 |
| 10,064,305 B1* | 8/2018 | Zhai | ................ | H05K 7/1427 |
| 10,474,205 B2* | 11/2019 | Hung | ................ | G06F 1/182 |
| 2006/0227505 A1* | 10/2006 | Miyamoto | ......... | H05K 7/20572 361/695 |
| 2007/0127204 A1* | 6/2007 | Muenzer | ................ | G06F 1/187 361/679.58 |
| 2007/0127206 A1* | 6/2007 | Wade | ................ | H05K 9/0041 361/679.31 |
| 2012/0236487 A1* | 9/2012 | Wallace | ................ | H05K 7/1489 361/679.31 |
| 2013/0294028 A1* | 11/2013 | Lafont | ................ | H05K 7/20563 361/694 |

* cited by examiner

*Primary Examiner* — Anthony Q Edwards
(74) *Attorney, Agent, or Firm* — Chun-Ming Shih; HDLS IPR Services

(57) ABSTRACT

A hard drive rack ventilation structure includes a primary rack, a plurality of secondary racks and hard drive units. The secondary racks are stacked in layers and assembled inside the primary rack. Each secondary rack includes a top portion and side portions extended downward from two sides thereof, and the two side portions include corresponding sliding tracks thereon. The hard drive units are installed on the sliding tracks of the secondary racks. Each hard drive unit includes a hard drive main body and a handle installed at a front thereof. A gap is formed between the handle and the hard drive main body. A top front edge of each secondary rack includes a hollow portion formed corresponding to the gap of each hard drive unit. The hollow portions and the gaps of the hard drive units are fluidly and vertically connected to form an airflow ventilation channel.

9 Claims, 4 Drawing Sheets

HARD DRIVE RACK VENTILATION STRUCTURE

BACKGROUND OF THE INVENTION

Field of the Invention

The technical field relates to the cooling of a server, in particular, to a hard drive rack ventilation structure.

Description of Related Art

With the popularity of network, a lot of digital data is accessed by network users via server architecture nowadays. Accordingly, servers need to be equipped with sufficient data storage devices; therefore, the design architecture of layers of hard drives installed in a server is developed.

Nevertheless, since hard drives generate heat during operation, and under the situation where great number of quantity and layers of hard drives are used, the temperature of a server tends to increase gradually due to the heat generated by each internal hard drive as well as the temperature at the surrounding of hard drives. To prevent the heat buildup at the internal of the server, it is known that the problem of heat dissipation can be reduced through certain separation distance configuration among the internal hard drives. However, as the separation distance becomes greater, the occupying space required also increases. Consequently, there is a need to overcome the technical problem of allowing external air to enter into the server to facilitate the heat dissipation thereof under the design limitation of pre-defined separation distance.

In view of above, the inventor seeks to overcome the aforementioned drawbacks associated with the currently existing technology after years of research and development along with the utilization of academic theories, which is also the objective of the development of the present invention.

SUMMARY OF THE INVENTION

A primary objective of the present invention is to provide a hard drive rack ventilation structure. The hard drive ventilation structure is formed of a hollow portion on the hard drive racks in order to increase the amount of external air entering into the separation distance among the hard drives installed on the racks. Consequently, the heat dissipation effect can be improved under the predefined space or separation distance design of the hard drive rack.

To achieve the aforementioned objective, the present invention provides a hard drive rack ventilation structure, comprising a primary rack, a plurality of secondary racks and a plurality of hard drive units. The plurality of secondary racks is stacked in layers and assembled inside the primary rack. Each one of the secondary racks includes a top portion and side portions extended downward from two sides of the top portion, and the two side portions include sliding tracks arranged thereon corresponding to each other. The plurality of hard drive units is installed on the sliding tracks of the plurality of secondary racks respectively. Each one of the hard drive units comprises a hard drive main body and a handle installed at a front end of the hard drive main body. A gap is formed between the handle and the hard drive main body. A front edge of a top portion of each one of the secondary racks includes a hollow portion formed correspondingly to the gap of each one of the hard drive units. The hollow portions and the gaps of the plurality of hard drive units are fluidly and vertically connected to each other to form an airflow ventilation channel.

DETAILED DESCRIPTION OF THE INVENTION

The following provides a detailed technical content of the present invention along with the accompanied drawings. However, the accompanied drawings are provided for reference and illustrative purpose only such that they shall not be used to limit the scope of the present invention.

Figure 1:
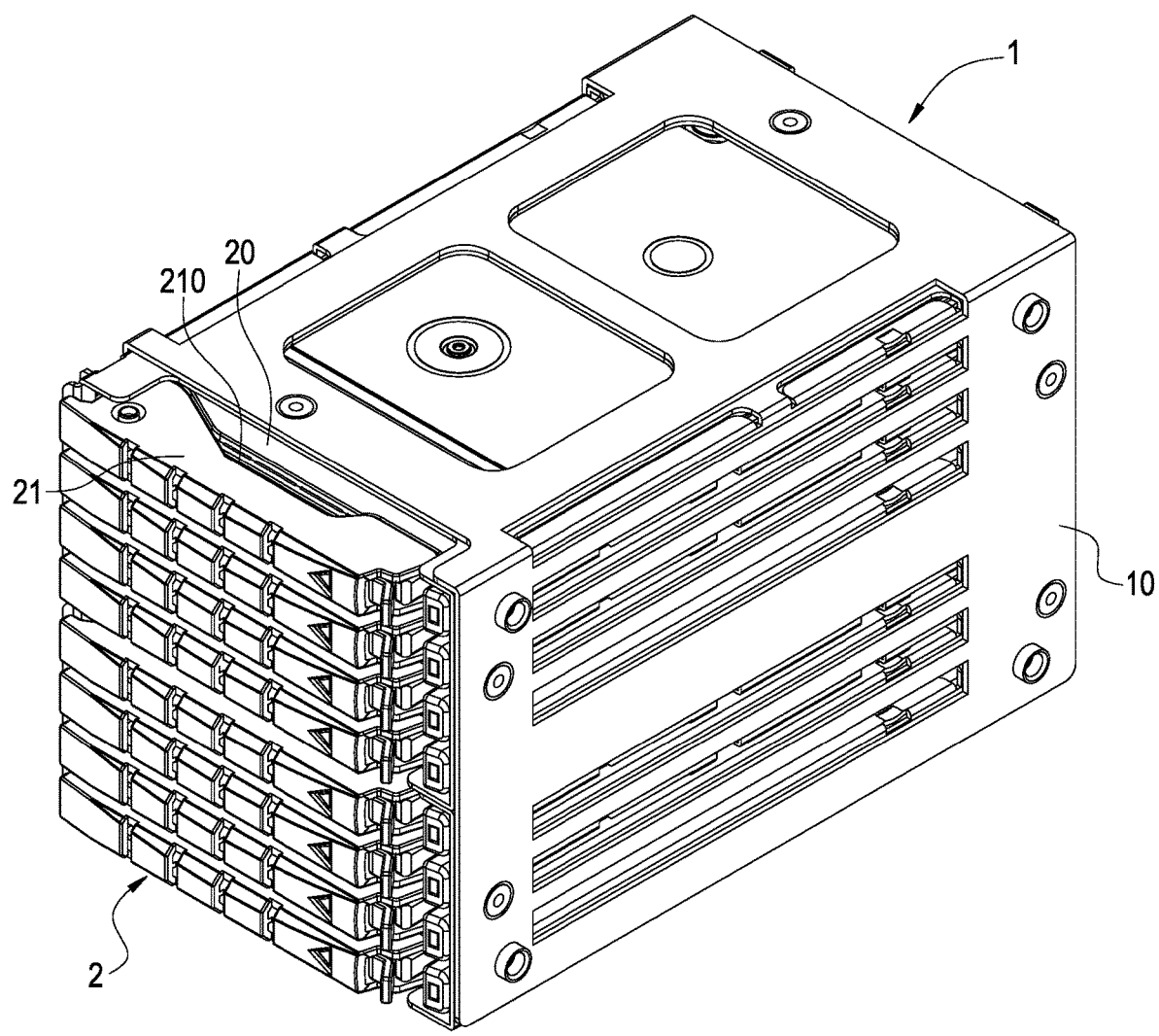
FIG. 1 is a perspective view of the hard drive rack ventilation structure of the present invention.
Figure 2:
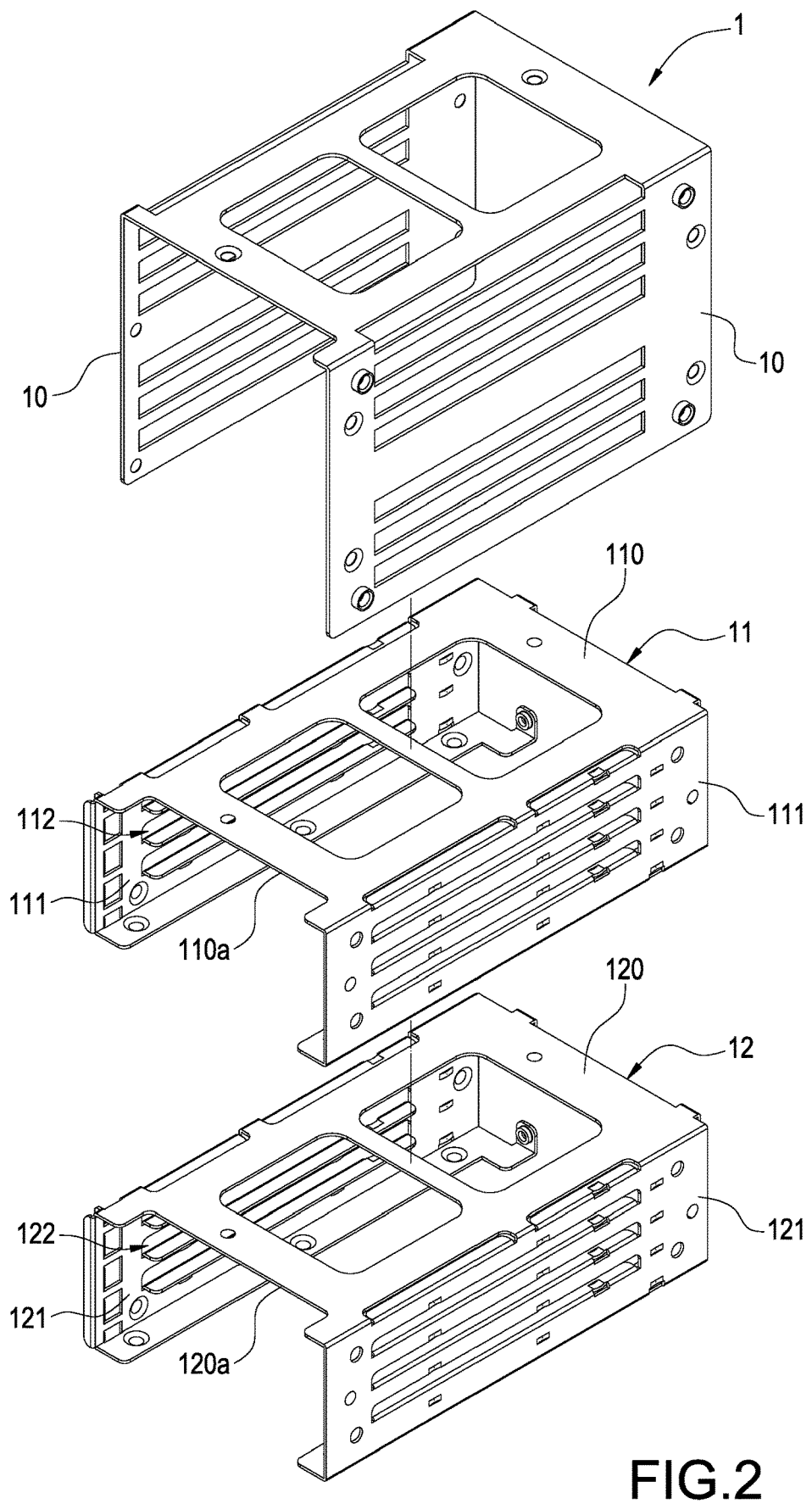
FIG. 2 is a perspective exploded view of the primary rack and the secondary racks of the present invention.
Figure 3:
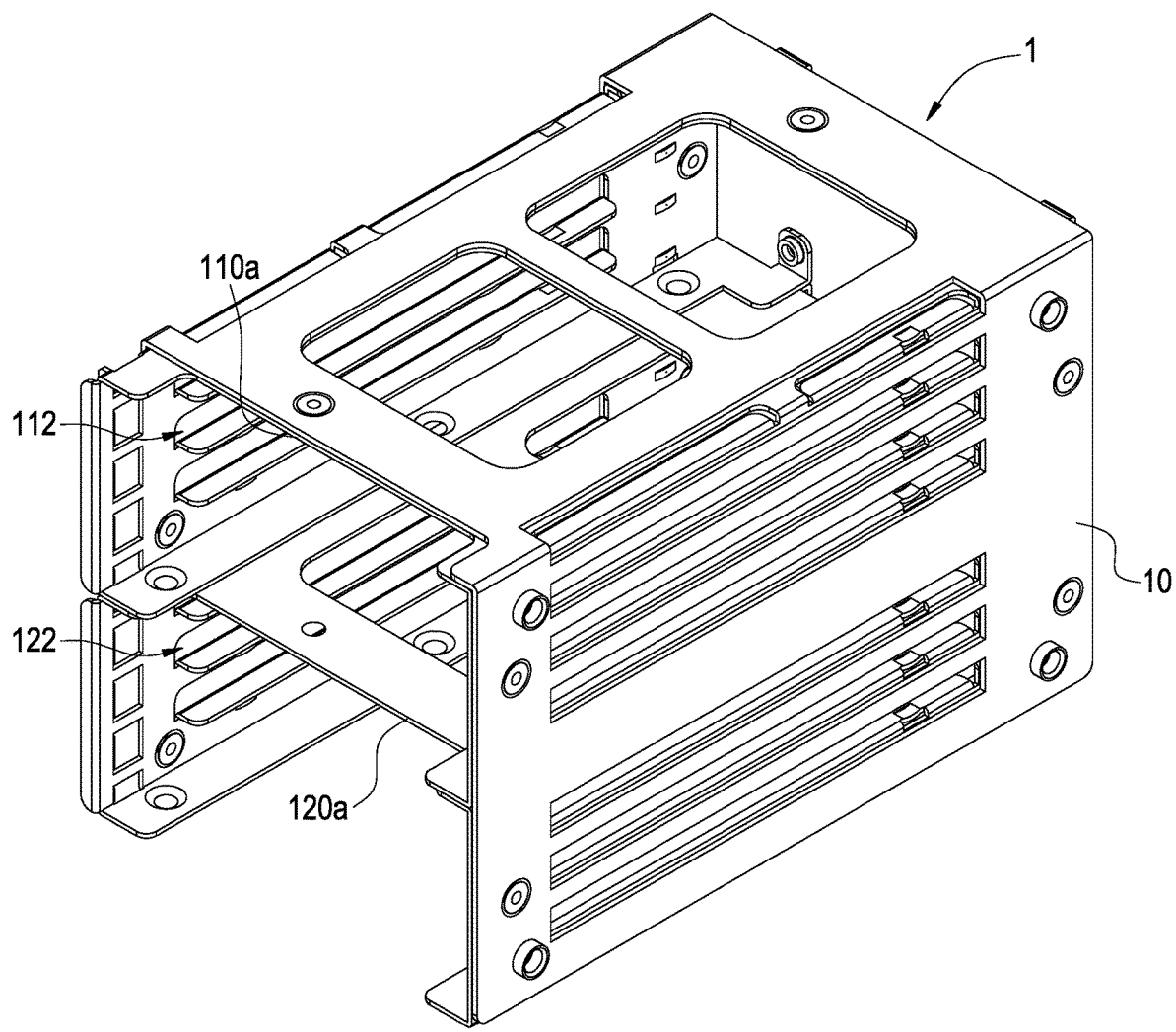
FIG. 3 is a perspective assembly view of the primary rack and the secondary racks of the present invention.

Please refer to FIG. 1, FIG. 2 and FIG. 3, showing a perspective view of a hard drive rack with ventilation structure of the present invention, perspective exploded view and perspective assembly view of primary rack and secondary racks respectively. The present invention provides a hard drive rack ventilation structure, and the hard drive rack is applicable to a server requiring the use of plurality of hard drives stacked in layers with a relatively compact configuration. The hard drive rack ventilation structure comprises a primary rack, a plurality of secondary racks 11 and 12 and a plurality of hard drive units 2.

Accordingly, the primary rack 1 can be formed by a sheet metal through stamping and bending processes, and it is used for integrating the aforementioned secondary racks 11 and 12. Therefore, the configuration of the primary rack 1 is not limited to the ones shown in the accompanied drawings of the present invention. It mainly comprises two frame walls 10 arranged spaced apart from each other in order to use the separation distance between the two frame walls 10 to allow each one of the secondary racks 11 and 12 to be installed therein.

The plurality of secondary racks 11 and 12 can also be formed by a sheet metal through stamping and bending processes and are assembled between the two frame walls 10 of the aforementioned primary rack 1 in order to facilitate the installation of required quantity of hard drives. To be more specific, each one of the secondary racks 11 and 12 includes a top portion 110/120. In addition, side portions 111/121 extend downward from the two sides of the top portion 110/120 respectively, and sliding tracks 112/122 are correspondingly arranged on the two side portions 111/121. It can be understood that the secondary racks 11 and 12 can be stacked in layers depending upon the actual quantity demand of the hard drives in order to use known fixation methods, such as fastening screws or other assembly methods, to assembly the secondary racks 11 and 12 between the two frame walls 10 of the primary rack 1.

The plurality of hard drive units 2 can be installed inside each one of the aforementioned secondary racks 11 and 12. Each one of the hard drive units 2 comprises a hard drive main body 20 and a handle 21 installed at a front end of the hard drive main body 20. In addition, the hard drive main body 20 can be horizontally inserted into the sliding tracks 112/122 provided at the internal of the two side portions 111/121 of each one of the secondary racks 11 and 12. The handle 21 is exposed outside of the secondary rack 11, such that during the removal of the hard drive main body 20, the handle 21 can be pulled in order to remove the corresponding hard drive main 20 out of the secondary rack 11 or 12.

Figure 4:
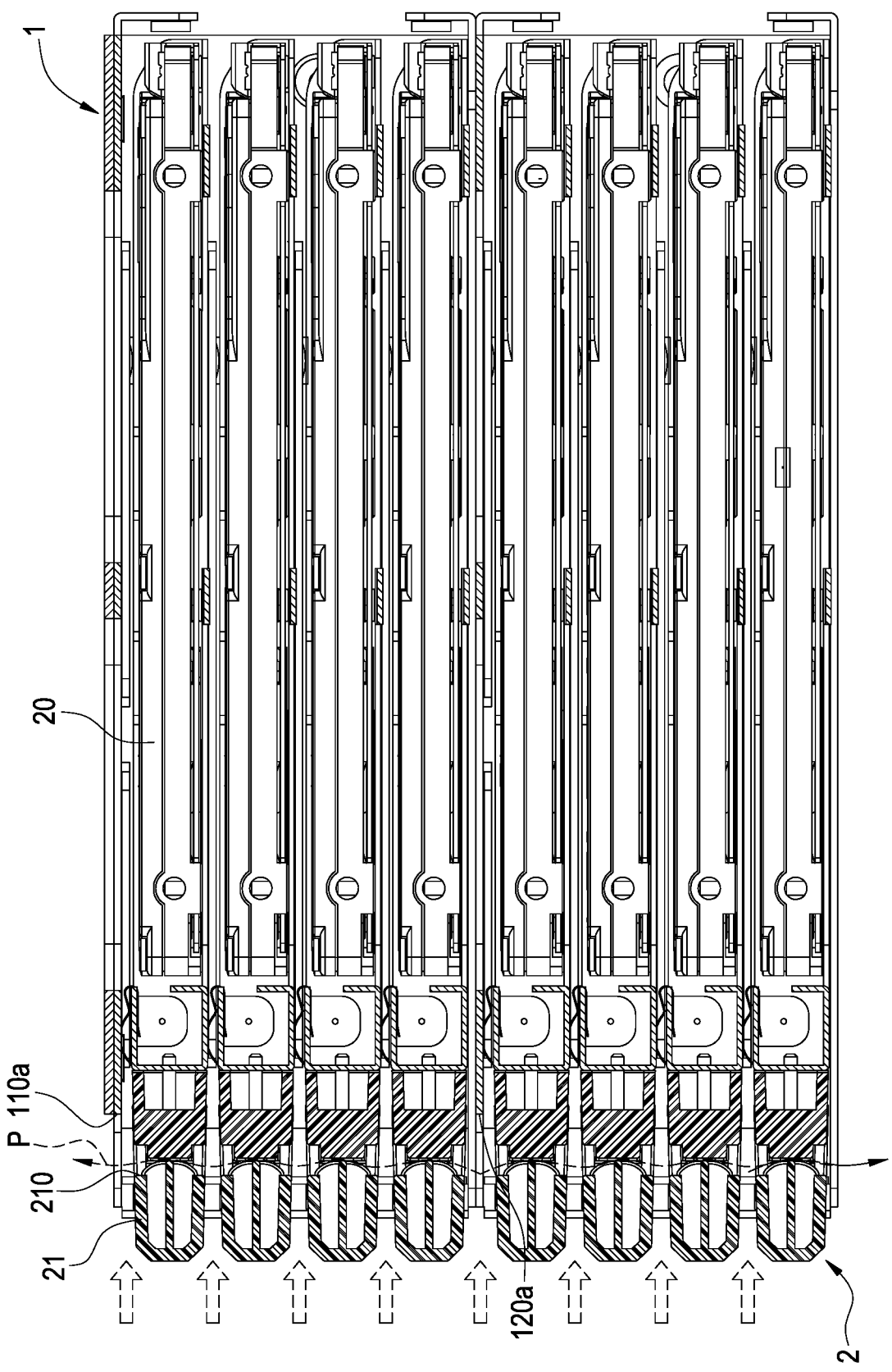
FIG. 4 is cross sectional view showing the introduction of external airflow into the hard drive rack ventilation structure of the present invention to achieve the fluidly connection effect.

As shown in FIG. 4. in an exemplary embodiment of the present invention, a gap 210 is formed between the hard drive main body 20 and the handle 21 of each hard drive unit 2, and the front edge of the top portion 110 and 120 of each secondary rack 11 and 12 includes a hollow portion 110a and 120a formed corresponding to the gap 210 of each hard drive unit 2. The hollow portion 110a and 120a can be a notch recessed inward at the front edge of the top portion 110 and 120, or it can also be a cut-out portion (not shown in the drawings) formed adjacent to the front edge of the top portion 110 and 120. Furthermore, the hollow portion 110a and 120a is fluidly and vertically connected to the gap 210 of each hard drive unit 2 in order to form an airflow ventilation channel P.

Consequently, with the aforementioned structural assembly, the hard drive rack ventilation structure of the present invention can be achieved.

Accordingly, as shown in FIG. 4, when the secondary racks 11 and 12 are installed to carry a plurality of hard drive units 2 at full capacity and during the operation of the server, the external air is able to be drawn in or out from the front end of the primary rack 1. Since the airflow may not be uniform, the gaps among the hard drive units 2 cannot maintain a smooth airflow therethrough. To overcome such drawback, with the airflow ventilation channel P provided in the present invention and fluidly connected to the gaps 210 among hard drive units 2, the external air is able to enter from the top most or the bottom most hard drive unit 2, or to allow the hot air at the internal to be exhaust out with ease. As a result, all of the hard drive units 2 installed at different layers can obtain a preferable head dissipation effect through the design of the airflow ventilation channel P, and the issue of machine shutdown due to high temperature caused by the accumulation of heat generated by the hard drive units 2 installed at the middle layers of the rack can be overcome.

Furthermore, as shown in FIG. 1, in a preferred exemplary embodiment of the present invention, in terms of the scope of the vertical projection of the hollow portions 110a and 120a in a top-down or bottom-up manner, the scope of the hollow portions is able to cover the scope of the gaps 210 in order to facilitate the air to enter from the external space more easily.

In view of the above, the present invention is able to achieve the objectives of the present invention and to overcome the drawbacks of known arts. The present invention is novel and of inventive step, which satisfies the patentability requirements.

The above describes the preferable and feasible exemplary embodiments of the present invention for illustrative purposes only, which shall not be treated as limitations of the scope of the present invention. Any equivalent changes and modifications made in accordance with the scope of the claims of the present invention shall be considered to be within the scope of the claim of the present invention.

What is claimed is:

1. A hard drive rack ventilation structure, comprising:
a primary rack;
a plurality of secondary racks stacked in layers and assembled inside the primary rack; each one of the secondary racks having a top portion and side portions extended downward from two sides of the top portion respectively, and the two side portions having sliding tracks arranged thereon corresponding to each other; and
a plurality of hard drive units installed on the sliding tracks of the plurality of secondary racks respectively; each one of the hard drive units comprising a hard drive main body and a handle installed at a front end of the hard drive main body; a gap formed between the handle and the hard drive main body;
wherein a front edge of a top portion of each one of the secondary racks concaves inwardly to form a hollow portion corresponding to the gap of each one of the hard drive units; the hollow portions and the gaps of the plurality of hard drive units are fluidly and vertically connected to each other to form an airflow ventilation channel.

2. The hard drive rack ventilation structure according to claim 1, wherein the primary rack is formed by a sheet metal through stamping and bending processes.

3. The hard drive rack ventilation structure according to claim 2, wherein the plurality of secondary racks is formed by a sheet metal through stamping and bending processes.

4. The hard drive rack ventilation structure according to claim 1, wherein the plurality of secondary racks is formed by a sheet metal through stamping and bending processes.

5. The hard drive rack ventilation structure according to claim 1, wherein the primary rack includes two frame walls arranged spaced apart from each other, and the plurality of secondary racks are installed between the two frame walls of the primary rack.

6. The hard drive rack ventilation structure according to claim 1, wherein the hard drive main bodies of the plurality of hard drive units are horizontally inserted into the sliding tracks of the plurality of secondary racks respectively, and the handles of the plurality of hard drive units are exposed outside of the plurality of secondary racks.

7. The hard drive rack ventilation structure according to claim 1, wherein the hollow portion is a notch recessed inward at the front edge of the top portion of each one of the secondary racks.

8. The hard drive rack ventilation structure according to claim 1, wherein the hollow portion is a cut-out portion formed adjacent to the front edge of the top portion of each one of the secondary racks.

9. The hard drive rack ventilation structure according to claim 1, wherein the hollow portion is of a scope covering a scope of the gap of each one of the secondary racks.

* * * * *